(12) United States Patent
Chen et al.

(10) Patent No.: US 10,782,445 B2
(45) Date of Patent: Sep. 22, 2020

(54) LOGGING-WHILE-DRILLING TOOL WITH INTERLEAVED INSTRUMENTS

(71) Applicant: Halliburton Energy Services, Inc., Houston, TX (US)

(72) Inventors: Songhua Chen, Katy, TX (US); Arcady Reiderman, Katy, TX (US); Lilong Li, Humble, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 168 days.

(21) Appl. No.: 15/504,648

(22) PCT Filed: Oct. 2, 2015

(86) PCT No.: PCT/US2015/053643
§ 371 (c)(1),
(2) Date: Feb. 16, 2017

(87) PCT Pub. No.: WO2017/058239
PCT Pub. Date: Apr. 6, 2017

(65) Prior Publication Data
US 2017/0242152 A1 Aug. 24, 2017

(51) Int. Cl.
*G01V 3/20* (2006.01)
*G01V 11/00* (2006.01)
*G01N 24/08* (2006.01)
*G01R 33/38* (2006.01)
*E21B 49/00* (2006.01)
(Continued)

(52) U.S. Cl.
CPC .............. *G01V 11/00* (2013.01); *E21B 49/00* (2013.01); *G01N 24/081* (2013.01); *G01R 33/3808* (2013.01); *G01V 3/20* (2013.01); *G01V 3/32* (2013.01); *G01V 5/12* (2013.01); *E21B 47/12* (2013.01); *G01R 33/3415* (2013.01); *G01R 33/383* (2013.01)

(58) Field of Classification Search
CPC . G01V 11/00; G01V 3/20; G01V 3/32; G01V 3/12; G01N 24/081; G01R 33/3808
See application file for complete search history.

(56) References Cited

U.S. PATENT DOCUMENTS 5,596,142 A * 1/1997 Delpuech ............ E21B 17/1021
73/152.17
5,646,528 A * 7/1997 Hanley .................. G01R 33/34
324/303

(Continued)

OTHER PUBLICATIONS

Extended European Search Report for Application No. 15905618.3 dated Dec. 12, 2018.

(Continued)

*Primary Examiner* — Dixomara Vargas
(74) *Attorney, Agent, or Firm* — Jason Sedano; C. Tumey Law Group PLLC

(57) ABSTRACT

Logging-while-drilling (LWD) tools may include multiple instruments interleaved into a compact configuration in a single drill string section that may be capable of nuclear magnetic resonance, resistivity, porosity, gamma density measurements, or any combination thereof. For example, a LWD tool may include a drill collar section containing: a nuclear magnetic resonance (NMR) electronics module and an NMR sensor module interleaved with a nuclear source and at least one nuclear detector.

20 Claims, 5 Drawing Sheets

(51) Int. Cl.
*G01V 3/32* (2006.01)
*G01V 5/12* (2006.01)
*G01R 33/3415* (2006.01)
*G01R 33/383* (2006.01)
*E21B 47/12* (2012.01)

(56) References Cited

U.S. PATENT DOCUMENTS

| | | | |
|---|---|---|---|
| 5,814,988 A | 9/1998 | Itskovich et al. | |
| 5,828,214 A | 10/1998 | Taicher et al. | |
| 5,831,433 A | 11/1998 | Sezginer et al. | |
| 5,969,527 A * | 10/1999 | Slade | G01R 33/3657 324/303 |
| 6,255,817 B1 | 7/2001 | Poitzsch et al. | |
| 6,405,136 B1 * | 6/2002 | Li | H03M 7/30 702/10 |
| 6,446,736 B1 * | 9/2002 | Kruspe | E21B 33/1243 175/40 |
| 6,516,898 B1 | 2/2003 | Krueger | |
| 6,637,524 B2 * | 10/2003 | Kruspe | E21B 33/1243 175/40 |
| 6,739,409 B2 | 5/2004 | Kruspe et al. | |
| 7,073,378 B2 | 7/2006 | Smits et al. | |
| 7,073,387 B2 | 7/2006 | Zdeblick et al. | |
| 7,083,006 B2 * | 8/2006 | Kruspe | E21B 33/1243 175/40 |
| 7,114,565 B2 * | 10/2006 | Estes | E21B 44/00 166/255.2 |
| 7,168,508 B2 | 1/2007 | Goldberg et al. | |
| 7,301,338 B2 * | 11/2007 | Gillen | E21B 47/04 324/303 |
| 7,334,465 B2 | 2/2008 | Smits et al. | |
| 7,565,833 B2 * | 7/2009 | Gillen | G01N 24/081 73/152.02 |
| 7,617,050 B2 * | 11/2009 | Allen | G01V 3/38 702/7 |
| 7,925,483 B2 * | 4/2011 | Xia | G01V 1/40 703/10 |
| 8,362,782 B2 * | 1/2013 | Dorovsky | G01V 1/44 324/346 |
| 8,614,573 B2 * | 12/2013 | Minh | G01V 3/18 324/303 |
| 8,637,807 B2 | 1/2014 | Evans et al. | |
| 9,175,559 B2 * | 11/2015 | Dowla | E21B 17/08 |
| 2002/0108784 A1 * | 8/2002 | Kruspe | E21B 33/1243 175/40 |
| 2004/0089475 A1 * | 5/2004 | Kruspe | E21B 33/1243 175/45 |
| 2004/0222019 A1 * | 11/2004 | Estes | E21B 44/00 175/45 |
| 2005/0028586 A1 | 2/2005 | Smits et al. | |
| 2005/0223790 A1 * | 10/2005 | Engels | G01V 11/00 73/152.02 |
| 2005/0257610 A1 * | 11/2005 | Gillen | E21B 47/04 73/152.02 |
| 2008/0021654 A1 * | 1/2008 | Gillen | E21B 47/04 702/11 |
| 2010/0122847 A1 * | 5/2010 | Xia | G01V 1/40 175/41 |
| 2011/0060526 A1 | 3/2011 | Faivre et al. | |
| 2011/0068788 A1 * | 3/2011 | Minh | G01V 3/18 324/303 |
| 2011/0077867 A1 | 3/2011 | Evans et al. | |
| 2011/0290011 A1 * | 12/2011 | Dowla | E21B 17/08 73/152.16 |
| 2013/0154844 A1 * | 6/2013 | Montgomery | G01V 3/18 340/853.1 |
| 2013/0282289 A1 * | 10/2013 | Lotfy | E21B 47/00 702/7 |
| 2015/0061664 A1 | 3/2015 | Reiderman et al. | |
| 2016/0053608 A1 * | 2/2016 | Dowla | E21B 17/08 166/254.2 |
| 2016/0230549 A1 * | 8/2016 | Cao Minh | E21B 49/08 |
| 2016/0238739 A1 * | 8/2016 | Cao Minh | G01V 11/002 |

OTHER PUBLICATIONS

International Search Report and Written Opinion from PCT/US2015/053643, dated Jun. 29, 2016.

* cited by examiner

LOGGING-WHILE-DRILLING TOOL WITH INTERLEAVED INSTRUMENTS

BACKGROUND

The present application relates to logging-while-drilling (LWD) tools with multiple instruments.

LWD tools are commonly used to measure properties of a surrounding formation while drilling a wellbore that penetrates the formation. Various configurations of LWD tools may include one or more instruments for measuring resistivity, porosity, formation bulk density, formation photoelectric factor, and the like. As more instruments are added to the LWD tool, additional length is required. For example, some LWD tools with multiple instruments have lengths of about eighteen meters and longer. This length constrains the trajectory of the drilling operations such that any turns or deviations in the wellbore must be configured to allow for the length of the LWD tool to pass through the wellbore.

One solution to shrinking the length of LWD tools is to incorporate fewer instruments in each LWD tool. However, this limits the amount and type of characteristics of the formation that can be assessed. Therefore, LWD tools implement different sensors on different drill collars, which significantly increases the total length and the total cost of the LWD tool. Because of the extended total length, the sensors in the different collars pass the sections of the formation at different times, thereby, causing depth synchronization problem when analyzing data acquired by different LWD sensors. Additionally, because drilling fluid infiltrates the surrounding formation over time and the measurements from each instrument is at a different time, the comparison of the data from different sensor becomes onerous.

Another design parameter of LWD tools is that the measurement principles of many LWD sensors require the transmitter(s) and receiver(s) (also referred to as source(s) and detector(s), respectively) to be spaced from each other for a finite length, which is often long length, in order to effectively sense for characteristics of the formation. Typically, two signals are considered for effective sensing: (1) a signal that penetrates into the formation and (2) a signal that directly travels from source to the detector without passing through the formation. To meet the requirements of formation penetration and the direct signal isolation, the length of the individual sensor may be longer than that is required to implement the physical size of the transmitters and receivers, electronics, and the direct signal isolation elements, which may leave empty drill collar space therebetween.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

The present application relates to logging-while-drilling (LWD) tools with multiple instruments interleaved into a compact configuration. The interleaved LWD tools described herein may be capable of nuclear magnetic resonance, resistivity, porosity, and gamma density measurements by uniquely integrating the components of corresponding instruments into a single drill string section. As used herein, the term "drill string section" refers to a single drill pipe or like structure that may be coupled to other drill pipes to form a drill string. A typical drill pipe is about 27 to 32 feet long, but longer lengths up to about 45 feet may be produced.

The problems associated with the length of prior LSW tools may be addressed by interleaving two or more of the instruments in a LWD tool.

As used herein, the term "interleaved" refers to interspersing of components. For example, two interleaved instrument modules along a drill collar would describe a first instrument module being in at least two portions along the drill collar with the second instrument module (or a portion thereof) being positioned between the at least two portions of the first instrument module. By way of further example, a first instrument module (IN) may be interleaved with more than one additional module (AM1 and AM2), such that the first instrument module has at least two portions with the two additional modules situated between the portions of the first instrument module such that: IN-AM1-AM2-IN or IN-AM1-IN-AM2-IN, etc.

Many LWD tools require portions of the instruments be separated for accurate measurements and to mitigate interference. For example, a source and a detector may be spaced apart by ten feet or more. Additionally, drill string sections may be placed between individual LWD tools to mitigate source/detector interference between the two tools. Accordingly, a drill string with multiple LWD tools each housed in individual drill string sections has significant amounts of unused space and may span several hundred feet of the drill string. The interleaved configurations described herein have the components of two or more LWD tools positioned within a single drill string section (e.g., in a tubular less than about 45 feet long) in a way that mitigates interference between the components of each of the LWD tools.

Figure 1:
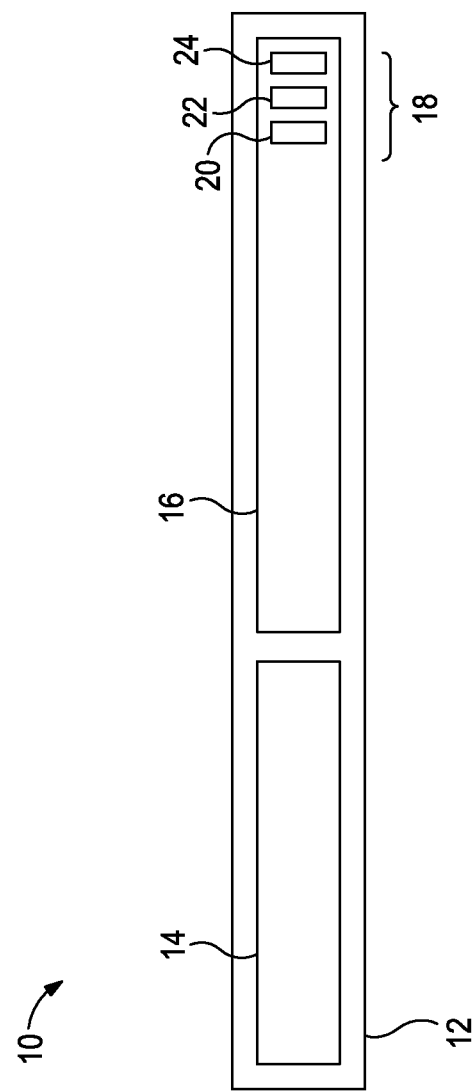
FIG. 1 provides an axial cross-sectional diagram of a LWD tool with interleaved instruments in a single drill collar section.

FIG. 1 provides an axial cross-sectional diagram of an exemplary LWD tool 10 with interleaved instruments in a single drill collar (or drill string) section 12 (e.g., having a length of about 27 to about 45 feet long), according to at least some embodiments described. The illustrated LWD tool 10 includes components for measuring nuclear magnetic resonance and porosity. Along the length of the drill collar section 12 are the following components: a nuclear magnetic resonance (NMR) electronics module 14 and an NMR sensor module 16 interleaved with a nuclear module 18 (e.g., a neutron module) (illustrated as a nuclear source 20 (e.g., a neutron source) and nuclear detectors 22,24 (e.g., neutron detectors)).

In the illustrated configuration of FIG. 1, the first nuclear detector 22 is positioned closer to the nuclear source 20 than the second nuclear detector 24. This configuration of two detectors 22,24 provides for near and far nuclear detectors, respectively, which enables a near-to-far signal ratio analysis that is less sensitive to environmental effects than a single detector.

Figure 2:
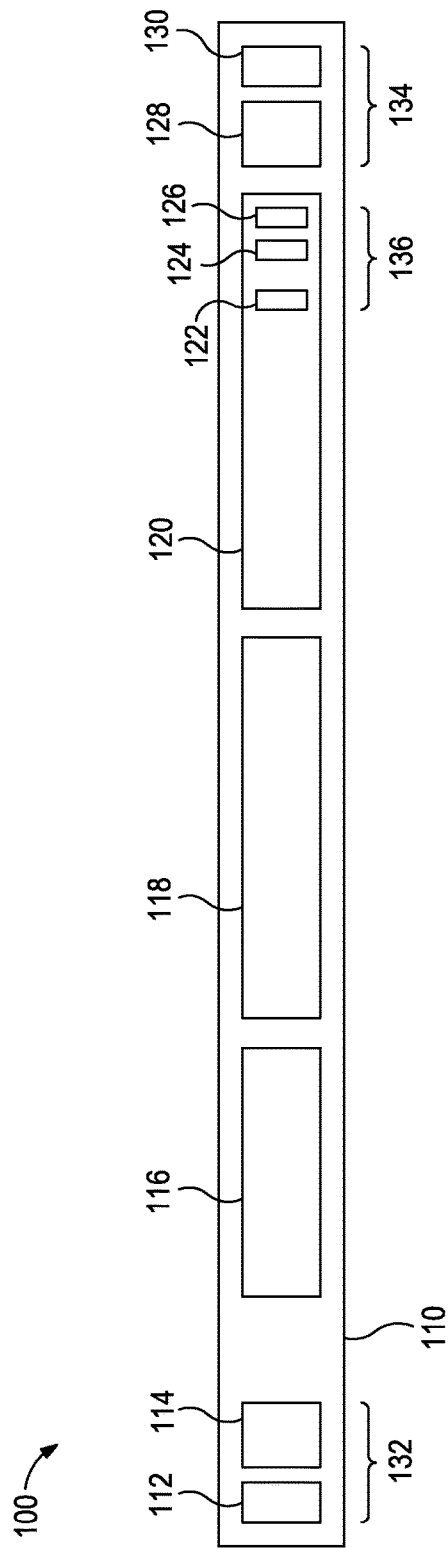
FIG. 2 provides an axial cross-sectional diagram of an alternative embodiment of a LWD tool with interleaved instruments in a single drill collar section.

FIG. 2 provides an axial cross-sectional diagram of another exemplary LWD tool 100 with interleaved instruments in a single drill collar (or drill string) section 110, according to at least some embodiments described. In the illustrated LWD tool 100, several instrument components are included to allow for nuclear magnetic resonance, resistivity, porosity, and gamma density measurement capabilities. Along the length of the drill collar section 110 are the following components: a first resistivity receiver module 132 (illustrated as a first z-direction resistivity receiver 112 and a first x- or y-direction resistivity receiver 114) gamma density module 116, a nuclear magnetic resonance (NMR) electronics module 118, an NMR sensor module 120 interleaved with a nuclear module 136 (illustrated as a nuclear source 122 and nuclear detectors 124,126), and a second resistivity receiver module 134 (illustrated as a second z-direction resistivity receiver 128 and a second x- or y-direction resistivity receiver 130).

The LWD tool 100 may preferentially have at least a portion of the NMR electronics module 118, the NMR sensor module 120, the first resistivity receiver module 132, the second resistivity receiver module 134, or a combination thereof disposed along the drill collar section 110 between the nuclear module 136 and the gamma density module 116. For example, as illustrated in FIG. 2, the nuclear components 122,124,126 and the gamma density module 116 are positioned at opposite axial ends of the NMR components 118,120 to provide sufficient spacing (e.g., about 5 to about 7 feet spacing) to mitigate interference.

In some instances, the first z-direction resistivity receiver 112 and the first x- or y-direction resistivity receiver 114 are remote receivers for investigating deeper into the surrounding formation, while the second z-direction resistivity receiver 128 and the second x- or y-direction resistivity receiver 130 are medium depth receivers. As described further herein, antennae in the NMR sensor module 120 may be used to investigate the resistivity of the formation at shallow depths from the tool 100. In some instances, each or the foregoing receivers 112,114,128,130 may be duplicated (i.e., have two of each of the receivers in the LWD tool 100), so that signals from the two identical receivers increase the accuracy of the resistivity measurements. For example, the phases of the signals measured by the illustrated receivers 112,114,128,130 and the duplicate receivers may be subtracted to assess the resistivity of the surrounding formation. The duplicate set of receivers may be spaced about 5 to about 7 feet apart from the corresponding illustrated receivers 112,114,128,130 with the corresponding resistivity electronics positioned therebetween.

The LWD tool 100 may preferentially have at least a portion of the nuclear module 136, the gamma density module 116, or a combination thereof are disposed along the drill collar section 110 between the first resistivity receiver module 132 configured for deeper measurements of the surrounding formation and the NMR sensor module 120. For example, as illustrated in FIG. 2 the gamma density module 116 is disposed between the first resistivity receiver module 132 and the NMR sensor module 120. As described further herein, the antennae in the NMR sensor module 120 may be used as RF transmitters where the resultant signals after interaction with the surrounding formation may be measured by the two resistivity receiver modules 132,134. Placement of the first resistivity receiver module 132 further from the NMR sensor module 120 may allow for deeper investigation of the surrounding formation.

While the LWD tool 100 includes several instrument components, in alternate embodiments, portions of the LWD tool may be excluded. For example, one or both of the two resistivity receiver module 132,134 may be excluded from the LWD tool 100. In another embodiment, the gamma density module 116 may be excluded from the LWD tool 100. In yet other embodiments, one or both of the two resistivity receiver module 132,134 and the gamma density module 116 may be excluded from the LWD tool 100.

Figure 3:
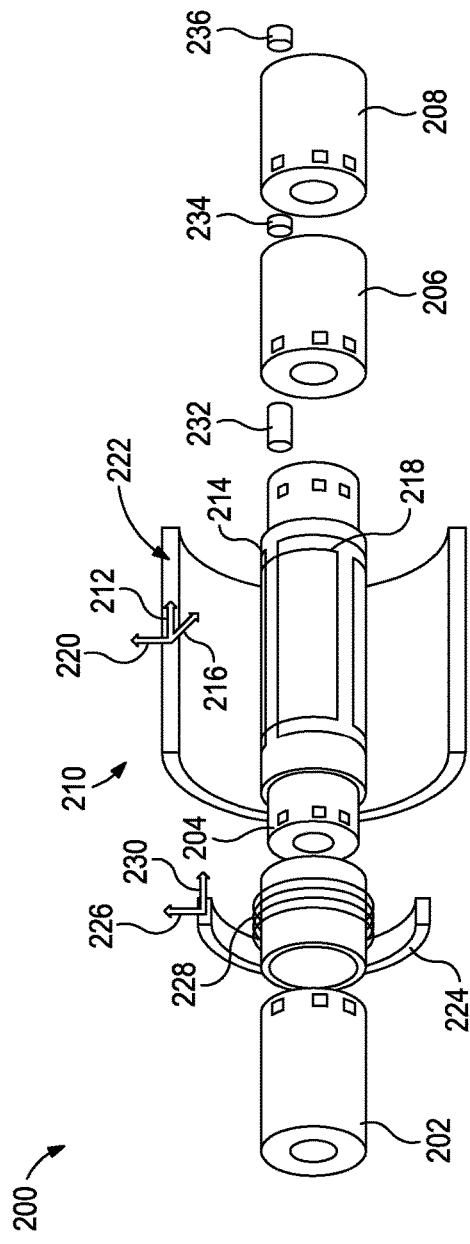
FIG. 3 provides an exploded isometric view of an exemplary nuclear magnetic resonance (NMR) sensor module suitable for use in an LWD tool, according to at least some embodiments described herein.

FIG. 3 provides an exploded isometric view of an exemplary NMR sensor module 200 suitable for use in an LWD tool, according to at least some embodiments described herein (e.g., as the NMR sensor module 16 or 120 of FIGS. 1 and 2, respectively). As illustrated, the NMR sensor module 200 may be interleaved with a nuclear source 232 and nuclear detectors 234,236. Moreover, the NMR sensor module 200 may include a magnet assembly that includes four magnets 202,204,206,208 arranged in series and used to acquire an NMR signal. The NMR sensor module 200 interleaved with a nuclear source 232 and nuclear detectors 234,236 is configured with the nuclear source 232 positioned between the central magnet 204 and the third magnet 206, the first nuclear detector 234 positioned between the third magnet 206 and the fourth magnet 208, and the second nuclear detector 236 positioned at the opposite end of the fourth magnet 208 from the first nuclear detector 234.

A central magnet area 210 with a central magnet 204 creates a primarily axial component of a static magnetic field $\vec{B}_{O1}$ 212, and two transversal dipole antennae 214 and 218 create RF magnetic fields $\vec{B}_{RF1}$ 216 and $\vec{B}_{RF2}$ 220, respectively. Together, these magnetic fields 212,216,220 produced in the central magnet area 210 create a first sensitive volume 222 that extends into a surrounding formation adjacent to the LWD tool.

The NMR sensor module 200 may be further configured to create a second sensitive volume 224 using the poles of a first magnet 202 and the central magnet 204, which result in the generation of a static magnetic field $\vec{B}_{O2}$ 226 and an NMR antennae 228 (illustrated as a longitudinal-dipole antennae) may generate an RF magnetic field $\vec{B}_{RF3}$ 230.

As illustrated, the first sensitive volume 222 and second sensitive volume 224 extend to different depths of investigation, which may be achieved by using different RF excitation frequencies when generating the corresponding $\vec{B}_{RF1}$ 216 and $\vec{B}_{RF2}$ 220 and $\vec{B}_{RF3}$ 230. Typically, the RF excitation frequency determined by the static magnetic field strength is in the range to 0.2 MHz to about 1 MHz. NMR experiments in sensitive volumes 222,224 may be run simultaneously or sequentially.

The NMR antennae 214,218,228 are preferably also used as resistivity transmitters to perform resistivity measurements.

Figure 4:
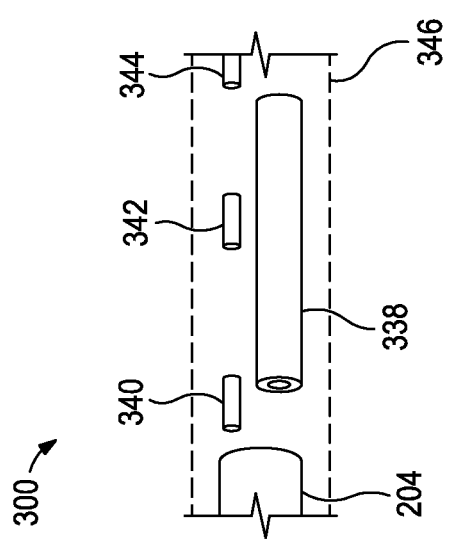
FIG. 4 provides a schematic diagram of an alternative configuration for a portion of an NMR sensor module suitable for use in an LWD tool, according to one or more embodiments.

FIG. 4 provides a schematic diagram of an alternative configuration for a portion of an NMR sensor module 300 suitable for use in an LWD tool, according to one or more embodiments. As illustrated, the NMR sensor module 300 may be interleaved with a nuclear source 340 and nuclear detectors 342,344. The illustrated portion of the NMR sensor module 300 depicts the central magnet 204 of FIG. 3 and extends through the nuclear components of the tool. The third and fourth magnets 206,208 of FIG. 3 are replaced in FIG. 4 with a single third magnet 338 having a smaller diameter. The smaller diameter third magnet 338 may prove advantageous in allowing for placement of the first nuclear detector 342 radially adjacent to the third magnet 338 (i.e., disposed between the third magnet 338 and the wall of a drill collar string 346). Similar to FIG. 3, the nuclear source 340 may be disposed between the central magnet 204 and the third magnet 336, and the second nuclear detector 344 may be positioned at the opposite end of the third magnet 336 from the nuclear source 340.

Figure 5:
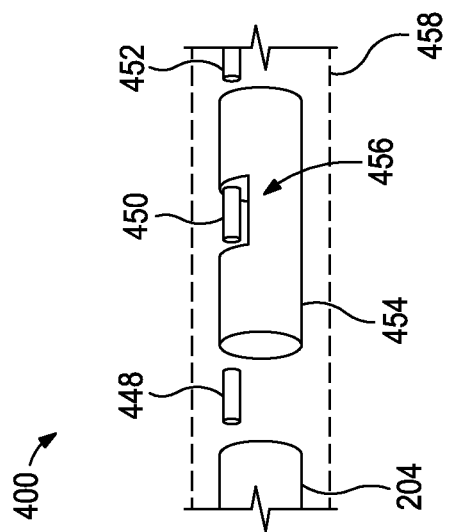
FIG. 5 provides a schematic diagram of an alternative configuration for a portion of an NMR sensor module suitable for use in a LWD tool, according to at least some embodiments described herein.

FIG. 5 provides a schematic diagram of an alternative configuration for a portion of an NMR sensor module 400 suitable for use in a LWD tool, according to at least some embodiments described herein. As illustrated, the NMR sensor module 400 may be interleaved with a nuclear source 448 and nuclear detectors 450,452. The illustrated portion of the NMR sensor module 400 depicts the central magnet 204 of FIG. 3 and extends through the nuclear components of the tool. The third and fourth magnets 206,208 of FIG. 3 are replaced in FIG. 5 with a single third magnet 454. As illustrated, a portion of the third magnet 454 may be removed to provide a smaller diameter portion 456. As will be appreciated, the smaller diameter portion 456 of the third magnet 454 may allow placement of a first nuclear detector 450 in the volume removed from the third magnet 454. Similar to FIG. 3, the nuclear source 448 is disposed between the central magnet 204 and the third magnet 454, and the second nuclear detector 452 is positioned at the opposite end of the third magnet 454 from the nuclear source 448.

Figure 6:
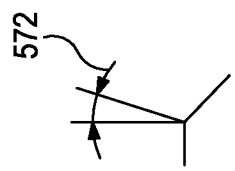
FIG. 6 depicts an isometric view of an alternative configuration for a central magnet area of an NMR sensor module that is suitable for use in a LWD tool, according to at least some embodiments described herein.
Figure 6:
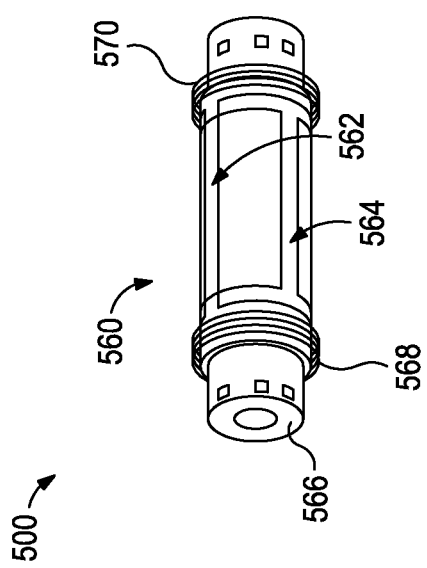

FIG. 6 depicts an isometric view of an alternative configuration for a central magnet area 560 of an NMR sensor module 500 that is suitable for use in a LWD tool, according to at least some embodiments described herein. The central magnet area 560 includes a central magnet 566 and one or more transverse dipole antennae (illustrated as two transverse dipole antennae 562,564) similar in function to the two transversal dipole antennae 214,218 of FIG. 3. The central magnet area 560 may further include two longitudinal dipole antennae 568,570. The at least one transverse dipole antennae (illustrated as two longitudinal dipole antennae 568, 570), if connected in reverse polarity, make a monopole antenna that, in combination with the at least one of the two transverse dipole antennae 562,564, enable unidirectional azimuthally selective measurements 572. For example, the NMR excitation may be substantially axially symmetrical using either the transversal dipole antennae 562,564 or the monopole antenna, while the combination of axially symmetrical sensitivity transversal-dipole antenna and the axially symmetrical sensitivity monopole antenna responses enables azimuthally resolved measurements 572. The monopole antenna generates a substantially radial RF magnetic field in a corresponding sensitive volume. Due to reciprocity, the same coil arrangement will have a radial sensitivity direction as illustrated in FIG. 7.

Figure 7:
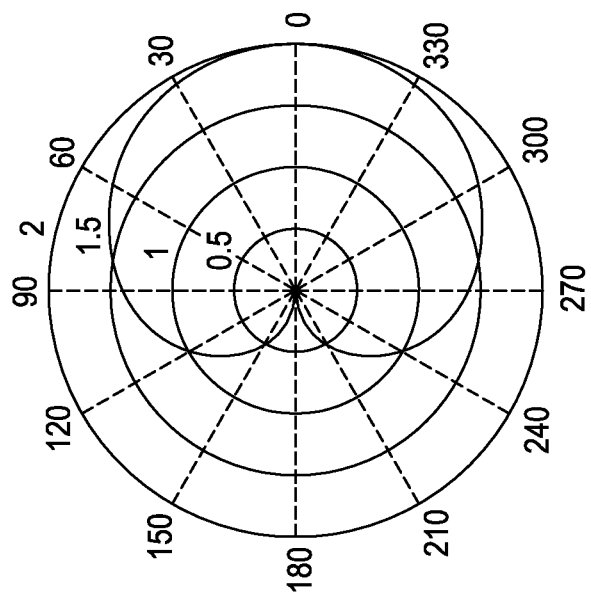
FIG. 7 illustrates a polar plot of the antenna sensitivity demonstrating its unidirectional azimuthal selectivity.

FIG. 7 illustrates a polar plot of sensitivity of the monopole and transverse dipole antennae demonstrating its unidirectional azimuthal selectivity. The radial grid of the polar plot is a normalized magnetic field intensity (unitless). The angular dependent distance from the coordinate origin (the antennae) to the plotted sensitivity illustrates the azimuthal selectivity of the antenna arrangement of FIG. 6. Therefore, a proper combination of the responses of each of the transverse dipole antennae 562,564 of FIG. 6 with the response of the monopole antenna (properly connected longitudinal dipole antennae 568,570) of FIG. 6 can give either one of four possible directions covering all quadrants of the transversal plane. Rotation of the drill string while drilling causes an amplitude modulation of the azimuthally selective response and, therefore, an amplitude modulation of the NMR relaxation signal (e.g., a CPMG echo train). The amplitude modulation parameters are indicative of the azimuthal variations of the NMR properties (e.g., the NMR porosity variations).

In some embodiments, all NMR antennae 562,564,568, 570 may be used as RF transmitters where the resultant signals after interaction with the surrounding formation may be measured by the two resistivity receiver modules 132,134 (FIG. 2). Further, the NMR antennae 562,564,568,570 themselves may be further used as receivers for measuring resistivity of the surrounding formation at shallow sensitive volumes. Additional receiver or transmitter antennae may be also used. The additional antennae may be placed on the same magnetic cores under the same protection sleeves as the NMR antennae 562,564,568,570. Resistivity data can be obtained by processing signals from all resistivity receivers.

In some embodiments, the monopole antenna (properly connected longitudinal dipole antennae 568,570 of FIG. 6) may be used in combination with the transverse dipole antennae 562,564 of FIG. 6 for shallow azimuthally selective resistivity measurements. The azimuthally selective resistivity measurements are obtained by combining impedance measurements for the monopole antenna and transverse dipole antennae 562,564.

The nuclear measurements as well as the gamma density measurements in the corresponding tool are also azimuthally selective with essentially the same azimuthal selectivity direction as the NMR (as illustrated in FIG. 6) and the shallow resistivity measurements. Combined azimuthally selective NMR, resistivity, nuclear, and gamma density measurements may increase the accuracy of the formation evaluation. In particular, NMR azimuthal sensitive volumes are oriented substantially the same as the density sensor orientations. As such, the NMR may assist in determining whether a change of density is due to a change in the formation matrix or porosity. Additionally, the NMR measurements and analysis may enhance the nuclear correction models by indicating washout problems.

The LWD tools described herein may further include other components of a bottomhole assembly common to the oil and gas industry. For example, a caliper tool, a natural gamma ray tool, a rotating or non-rotating stabilizer, or a combination thereof may be included in any of the LWD tools described herein.

Figure 8:
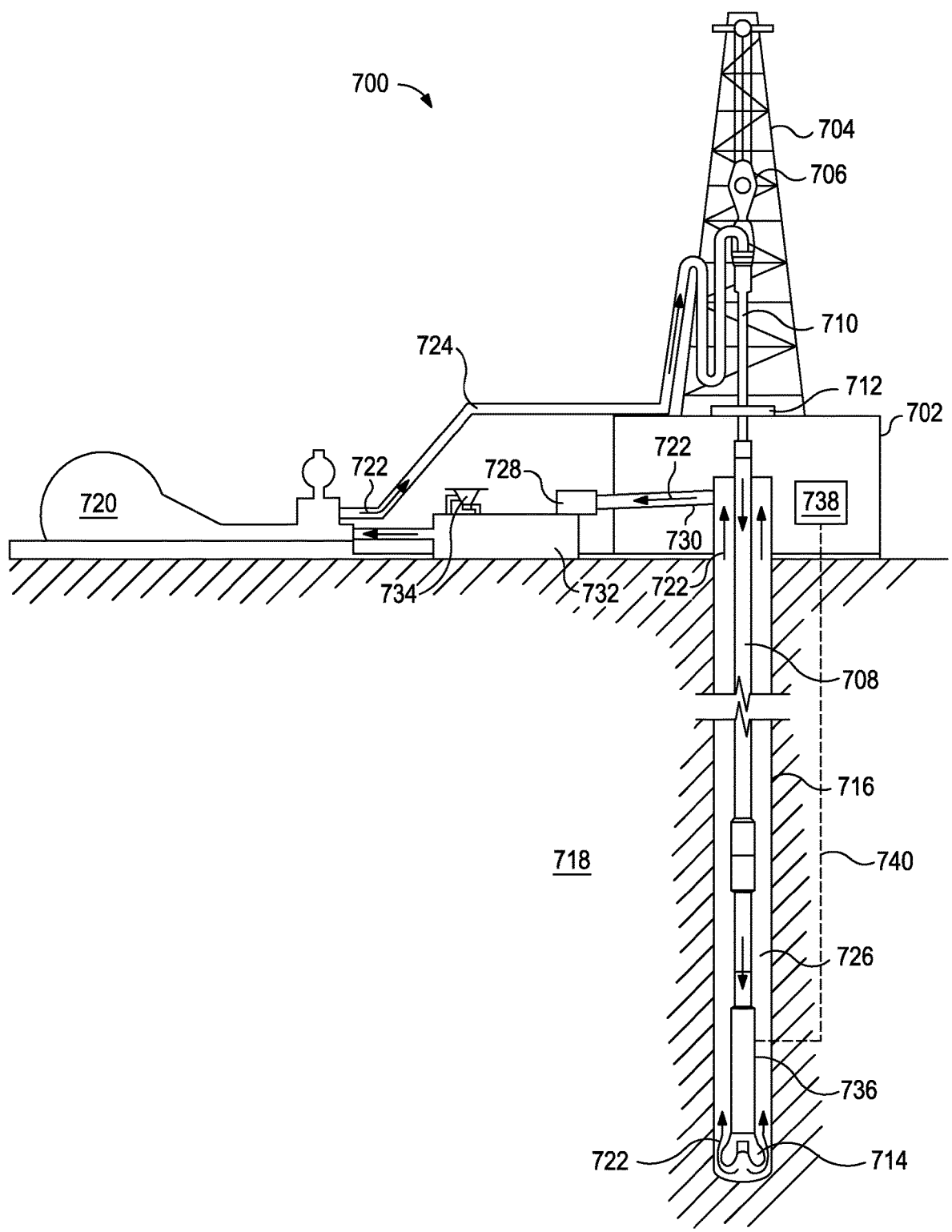
FIG. 8 illustrates an exemplary drilling assembly suitable for implementing the LWD tools describe herein.

FIG. 8 illustrates an exemplary drilling assembly 700 suitable for implementing the LWD tools described herein. It should be noted that while FIG. 8 generally depicts a land-based drilling assembly, those skilled in the art will readily recognize that the principles described herein are equally applicable to subsea drilling operations that employ floating or sea-based platforms and rigs, without departing from the scope of the disclosure.

As illustrated, the drilling assembly 700 may include a drilling platform 702 that supports a derrick 704 having a traveling block 706 for raising and lowering a drill string 708. The drill string 708 may include, but is not limited to, drill pipe and coiled tubing, as generally known to those skilled in the art. A kelly 710 supports the drill string 708 as it is lowered through a rotary table 712. A drill bit 714 is attached to the distal end of the drill string 708 and is driven either by a downhole motor and/or via rotation of the drill string 708 from the well surface. As the bit 714 rotates, it creates a wellbore 716 that penetrates various subterranean formations 718. Along the drill string 708, a LWD tool 736 described herein is included.

In the present application, the LWD tool 736 may be capable of NMR analysis of the subterranean formation 718 proximal to the wellbore 716. The LWD tool 736 may transmit the measured data wired or wirelessly to a processor 738 at the surface. Transmission of the data is generally illustrated at line 740 to demonstrate communicable coupling between the processor 738 and the LWD tool 736 and does not necessarily indicate the path to which communication is achieved.

A pump 720 (e.g., a mud pump) circulates drilling fluid 722 through a feed pipe 724 and to the kelly 710, which conveys the drilling fluid 722 downhole through the interior of the drill string 708 and through one or more orifices in the drill bit 714. The drilling fluid 722 is then circulated back to the surface via an annulus 726 defined between the drill string 708 and the walls of the wellbore 716. At the surface, the recirculated or spent drilling fluid 722 exits the annulus 726 and may be conveyed to one or more fluid processing unit(s) 728 via an interconnecting flow line 730. After passing through the fluid processing unit(s) 728, a "cleaned" drilling fluid 722 is deposited into a nearby retention pit 732 (i.e., a mud pit). While illustrated as being arranged at the outlet of the wellbore 716 via the annulus 726, those skilled in the art will readily appreciate that the fluid processing unit(s) 728 may be arranged at any other location in the drilling assembly 700 to facilitate its proper function, without departing from the scope of the scope of the disclosure.

Chemicals, fluids, additives, and the like may be added to the drilling fluid 722 via a mixing hopper 734 communicably coupled to or otherwise in fluid communication with the retention pit 732. The mixing hopper 734 may include, but is not limited to, mixers and related mixing equipment known to those skilled in the art. In other embodiments, however, the chemicals, fluids, additives, and the like may be added to the drilling fluid 722 at any other location in the drilling assembly 700. In at least one embodiment, for example, there could be more than one retention pit 732, such as multiple retention pits 732 in series. Moreover, the retention pit 732 may be representative of one or more fluid storage facilities and/or units where the chemicals, fluids, additives, and the like may be stored, reconditioned, and/or regulated until added to the drilling fluid 722.

The processor 738 may comprise a portion of computer hardware used to implement the various illustrative blocks, modules, elements, components, methods, and algorithms for analyzing the measurements described herein. The processor 738 may be configured to execute one or more sequences of instructions, programming stances, or code stored on a non-transitory, computer-readable medium. The processor 738 can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor 738 to perform the process steps to analyze the measurements described herein. One or more processors 738 in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to the processor 738 for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Embodiments disclosed herein include Embodiment A, Embodiment B, and Embodiment C.

Embodiment A is a LWD tool comprising: a drill collar section containing: a nuclear magnetic resonance (NMR) electronics module and an NMR sensor module interleaved with a nuclear source and at least one nuclear detector.

Embodiment A may have one or more of the following additional elements in any combination: Element A1: the LWD tool further comprising: a gamma density module contained by the drill collar section; Element A2: the LWD tool further comprising: a resistivity receiver module contained by the drill collar section; Element A3: the LWD tool further comprising: a gamma density module and a resistivity receiver module contained by the drill collar section; Element A4: Element A3 and wherein the resistivity receiver module comprises a z-direction resistivity receiver and an x- or y-direction resistivity receiver, and wherein the z-direction resistivity receiver, the x- or y-direction resistivity receiver, the gamma density module, the NMR electronics module, and the NMR sensor module interleaved with the nuclear source and nuclear detectors are each contained in and axially positioned in order along the drill collar section; Element A5: Element A3 and wherein the resistivity receiver module comprises a z-direction resistivity receiver and an x- or y-direction resistivity receiver, and wherein the gamma density module, the NMR electronics module, the NMR sensor module interleaved with the nuclear source and nuclear detectors, the z-direction resistivity receiver, and the x- or y-direction resistivity receiver are each contained in and axially positioned in order along the drill collar section; Element A6: Element A3 and wherein at least a portion of the NMR electronics module, the NMR sensor module, the first resistivity receiver module, the second resistivity receiver module, or a combination thereof are axially disposed along the drill collar section between the nuclear source and the at least one nuclear detector and the gamma density module; Element A7: Element A1 or Element A3 and wherein the gamma density module is at least about five feet from the nuclear source and the at least one nuclear detector; Element A8: the LWD tool further comprising: a first resistivity receiver module, a gamma density module, and a second resistivity receiver module, wherein the first resistivity receiver module investigates sensitive volumes at a deeper depth into a surrounding formation as compared to the second resistivity receiver module; Element A9: Element A8 and wherein at least a portion of the nuclear source and the at least one nuclear detector, the gamma density module, or a combination thereof are disposed along the drill collar section between first resistivity receiver module and the NMR sensor module; Element A10: wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet, a first nuclear detector, a fourth magnet, and a second nuclear detector; Element A11: wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein the third magnet has a smaller diameter than the first magnet and the central magnet; and Element A12: wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein a portion of the third magnet has a smaller diameter than the first magnet and the central magnet and the first nuclear detector is positioned radially adjacent to the portion.

By way of non-limiting example, exemplary combinations applicable to Embodiment A include: one of Elements A10-A12 in combination with one of Elements A1-A3 and optionally Element A7; one of Elements A10-A12 in combination with Element 3 and one of Elements A4-A6; one of Elements A10-A12 in combination with Element A7; one of Elements A10-A12 in combination with Element A8 and optionally Element A9; Elements A3 and A7 in combination with one of Elements A4-A6; and Element A1 in combination with Element A8.

Embodiment B is a LWD tool comprising: a drill collar section containing: a resistivity receiver module, a gamma density module, a nuclear magnetic resonance (NMR) electronics module, and an NMR sensor module interleaved with a nuclear source and at least one nuclear detector, wherein the NMR sensor module includes at least one transversal dipole antenna and a monopole antenna in a configuration for obtaining azimuthally selective NMR, resistivity, nuclear, and gamma density measurements.

Embodiment B may have one or more of the following additional elements in any combination: Element B1: wherein the resistivity receiver module comprises a z-direction resistivity receiver and a x- or y-direction resistivity receiver, and wherein the z-direction resistivity receiver, the x- or y-direction resistivity receiver, the gamma density module, the NMR electronics module, and the NMR sensor module interleaved with a nuclear source and nuclear detectors are each contained in and positioned in order axially along the drill collar section; Element B2: wherein the gamma density module is at least about five feet from the nuclear source and the at least one nuclear detector; Element B3: wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet, a first nuclear detector, a fourth magnet, and a second nuclear detector; Element B4: wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein the third magnet has a smaller diameter than the first magnet and the central magnet; Element B5: wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein a portion of the third magnet has a smaller diameter than the first magnet and the central magnet and the first nuclear detector is positioned radially adjacent to the portion.

By way of non-limiting example, exemplary combinations applicable to Embodiment B include: one of Elements B3-B5 in combination with Element B1 and one of Elements B3-B5 in combination with Element B2.

Embodiment C is a system comprising: a drill bit attached to the distal end of the drill string; a LWD tool disposed according to Embodiment A or Embodiment B (including each with any suitable combinations of corresponding Elements) along the drill string; and a pump operably connected to the drill string for circulating the drilling fluid through the drill string to an annulus defined by the drill string and the wellbore Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity.

It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While interleaved LWD tools are described herein in terms of "comprising" various components, the interleaved LWD tools can also "consist essentially of" or "consist of" the various components.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A logging-while-drilling (LWD) tool comprising:
   a drill collar section containing:
   (1) a nuclear magnetic resonance (NMR) electronics module and
   (2) an NMR sensor module separate and apart from the NMR electronics module and in which a nuclear source and at least one nuclear detector are interleaved between one or more magnets within the NMR sensor module and completely enclosed within the NMR sensor module.

2. The LWD tool of claim 1 further comprising: a gamma density module contained by the drill collar section.

3. The LWD tool of claim 1 further comprising: a resistivity receiver module contained by the drill collar section.

4. The LWD tool of claim 1 further comprising: a gamma density module and a resistivity receiver module contained by the drill collar section.

5. The LWD tool of claim 4, wherein the resistivity receiver module comprises a z-direction resistivity receiver and an x- or y-direction resistivity receiver, and wherein the z-direction resistivity receiver, the x- or y-direction resistivity receiver, the gamma density module, the NMR electronics module, and the NMR sensor module each contained in and axially positioned in order along the drill collar section.

6. The LWD tool of claim 4, wherein the resistivity receiver module comprises a z-direction resistivity receiver and an x- or y-direction resistivity receiver, and wherein the gamma density module, the NMR electronics module, the NMR sensor module, the z-direction resistivity receiver, and the x- or y-direction resistivity receiver are each contained in and axially positioned in order along the drill collar section.

7. The LWD tool of claim 4, wherein at least a portion of the NMR electronics module, the NMR sensor module, the first resistivity receiver module, the second resistivity receiver module, or a combination thereof are axially disposed along the drill collar section between the nuclear source and the at least one nuclear detector and the gamma density module.

8. The LWD tool of claim 4, wherein the gamma density module is at least about five feet from the nuclear source and the at least one nuclear detector.

9. The LWD tool of claim 1 further comprising a first resistivity receiver module, a gamma density module, and a second resistivity receiver module, wherein the first resistivity receiver module investigates sensitive volumes at a deeper depth into a surrounding formation as compared to the second resistivity receiver module.

10. The LWD tool of claim 9, wherein at least a portion of the nuclear source and the at least one nuclear detector, the gamma density module, or a combination thereof are disposed along the drill collar section between first resistivity receiver module and the NMR sensor module.

11. The LWD tool of claim 1, wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet, a first nuclear detector, a fourth magnet, and a second nuclear detector.

12. The LWD tool of claim 1, wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein the third magnet has a smaller diameter than the first magnet and the central magnet.

13. The LWD tool of claim 1, wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein a portion of the third magnet has a smaller diameter than the first magnet and the central magnet and the first nuclear detector is positioned radially adjacent to the portion.

14. A logging-while-drilling (LWD) tool comprising:
   a drill collar section containing: a resistivity receiver module,
   a gamma density module, (1) a nuclear magnetic resonance (NMR) electronics module disposed in the logging-while drilling tool, and (2) an NMR sensor module separate and apart from the NMR electronics module and in which a nuclear source and at least one nuclear detector are interleaved between one or more magnets within the NMR sensor module within the NMR sensor module, wherein the NMR sensor module includes at least one transversal dipole antenna and a monopole antenna in a configuration for obtaining azimuthally selective NMR, resistivity, nuclear, and gamma density measurements.

15. The LWD tool of claim 14, wherein the resistivity receiver module comprises a z-direction resistivity receiver and a x- or y-direction resistivity receiver, and wherein the z-direction resistivity receiver, the x- or y-direction resistivity receiver, the gamma density module, the NMR electronics module, and the NMR sensor module interleaved with a nuclear source and nuclear detectors are each contained in and positioned in order axially along the drill collar section.

16. The LWD tool of claim 14, wherein the gamma density module is at least about five feet from the nuclear source and the at least one nuclear detector.

17. The LWD tool of claim 14, wherein the NMR sensor module is interleaved 1Nith the nuclear source and bNo nuclear detectors and comprises, in order axially along the drill collar section: a first magnet, a longitudinal-dipole antennae, a central magnet coupled to two transversal dipole antennae, the nuclear source, a third magnet, a first nuclear detector, a fourth magnet, and a second nuclear detector.

18. The LWD tool of claim 14, wherein the NMR sensor module is interleaved with the nuclear source and two nuclear detectors and comprises, in order axially along the drill collar section: a first magnet, a longitudinal-dipole antennae, a central magnet coupled to bNo transversal dipole antennae, the nuclear source, a third magnet having a first nuclear detector radially adjacent thereto, and a second nuclear detector, wherein the third magnet has a smaller diameter than the first magnet and the central magnet.

19. The L\ND tool of claim 14, wherein the NMR sensor module is interleaved with the nuclear source and two nuclear detectors and comprises, in order axially along the drill collar section: a first magnet, a longitudinal-dipole antennae, a central magnet coupled to two transversal dipole antennae, the nuclear source, a third magnet having a first nuclear detector radially adjacent thereto, and a second nuclear detector, wherein a portion of the third magnet has a smaller diameter than the first magnet and the central magnet and the first nuclear detector is positioned radially adjacent to the portion.

20. A system comprising:
a drill bit attached to the distal end of the drill string;
a logging while drilling (LWD) tool disposed along the drill string, the LWD tool comprising a drill string section containing:
(1) a nuclear magnetic resonance (NMR) electronics module and
(2) an NMR sensor module separate and apart from the NMR electronics module and in which a nuclear source and at least one nuclear detector are interleaved between one or more magnets within the NMR sensor module and completely enclosed within the NMR sensor module; and
a pump operably connected to the drill string for circulating the drilling fluid through the drill string to an annulus defined by the drill string and the wellbore.

* * * * *